United States Patent [19]

Tsubai et al.

[11] Patent Number: 4,510,228
[45] Date of Patent: Apr. 9, 1985

[54] LITHOGRAPHIC PRINTING PLATE WITH GELATIN LAYERS HAVING PH VALUES BELOW ISOELECTRIC POINT

[75] Inventors: Yasuo Tsubai; Yoshikazu Takaya; Eiji Kanada, all of Nagaokakyo, Japan

[73] Assignee: Mitsubishi Paper Mills, Ltd., Tokyo, Japan

[21] Appl. No.: 486,837

[22] Filed: Apr. 20, 1983

[30] Foreign Application Priority Data

Apr. 22, 1982 [JP] Japan .................................. 57-67763
May 13, 1982 [JP] Japan .................................. 57-80784

[51] Int. Cl.$^3$ .......................... G03C 5/54; G03C 1/30; G03C 7/06
[52] U.S. Cl. ................................ 430/204; 430/229; 430/230; 430/232; 430/621; 430/642; 101/453
[58] Field of Search ............... 430/204, 230, 232, 229, 430/246, 642; 101/453, 461

[56] References Cited

U.S. PATENT DOCUMENTS

| | | | |
|---|---|---|---|
| 3,089,770 | 5/1963 | Gunther et al. | 430/204 |
| 4,160,670 | 7/1979 | Tsubai et al. | 430/204 |
| 4,175,965 | 11/1979 | Yoshida et al. | 430/230 |
| 4,355,090 | 10/1982 | Yamada et al. | 430/204 |
| 4,360,590 | 11/1982 | Tomka | 430/642 |
| 4,401,739 | 8/1983 | Senga et al. | 430/204 |

*Primary Examiner*—Richard L. Schilling
*Attorney, Agent, or Firm*—Cushman, Darby & Cushman

[57] ABSTRACT

Disclosed is a photosensitive element for the production of lithographic printing plates improved in printing endurance comprising a support, a physical development nuclei layer, and at least one gelatin-containing layer including a silver halide emulsion layer disposed under said nuclei layer, which is adapted to the silver complex diffusion transfer process to utilize the transferred silver image on said nuclei layer as ink-receptive areas, all of the gelatin-containing layers having a pH value below the isoelectric point of the gelatin used in each layer. Further improvement can be attained by using a photographic gelatin and a low molecular weight gelatin in at least one of said gelatin-containing layers.

13 Claims, No Drawings

LITHOGRAPHIC PRINTING PLATE WITH GELATIN LAYERS HAVING PH VALUES BELOW ISOELECTRIC POINT

BACKGROUND OF THE INVENTION

This invention relates to a photosensitive element for the production of a lithographic printing plate by utilizing the silver complex diffusion transfer process and to a method for preparing such a printing plate.

A lithographic printing plate comprised oleophilic image areas receptive to a greasy ink and oleophilic non-image areas nonreceptive to the ink, said non-image areas being generally made hydrophilic to receive water. Accordingly, the common lithographic printing is performed by feeding both ink and water to the plate surface to allow the image areas to receive preferentially the coloring ink and the non-image areas preferentially the water, and transferring the ink on the image areas to a substrate material such as, for example, paper. In order to produce good prints, it is necessary that both the oleophilicity of image areas and the hydrophilicity of non-image areas be sufficiently high so that when an ink and water are fed to the printing plate surface, the image areas may receive a sufficient amount of the ink and the non-image areas may receive entirely no ink.

The disadvantages accompanying the printing plate produced by the silver complex diffusion transfer process (DTR process) include comparatively rapid deterioration in the endurance of printing ability (printing endurance) owing to an insufficient resistance of the image area against mechanical wear which causes disappearance or gradual deterioration of ink-receptivity of the hydrophobic areas carrying an inked image; build-up of the ink in non-image areas or background owing to gradual sensitization of hydrophilic areas; and deterioration of uniform ink-receptivity of hydrophobic areas, which results in fluctuation of the amount of ink held by the image areas and, hence, causes non-uniformity of the ink-receptivity in printing areas.

Printing plates which utilize as the ink-receptive areas a metallic silver pattern formed on nuclei layer by DTR process are already known [for example, U.S. Pat. Nos. 3,220,837 and 3,721,559; Japanese Patent Publication Nos. 16,725/73 and 30,562/73; Japanese Patent Application "Kokai" (Laid-open) Nos. 4,482,71 and 21,602/78]. Although some of them are in actual use, the above noted problems still remain unsolved.

As is the case with other lithographic printing plates, the lithographic printing plate utilizing DTR process is also required to be improved in printing endurance by improving the construction of printing plate composites, composition of processing solutions, and printing conditions. To meet the requirement, various attempts have heretofore been disclosed. Aside from the ink-receptivity of transferred silver grains precipitated on the nuclei layer, one of the principal factors which affect the printing endurance is loss of transferred silver in the image areas composed of thin lines.

One of the factors controlling the resistance of transferred silver to mechanicl wear is the type of solvent for silver halides as disclosed in Japanese Patent Application "Kokai" (Laid-open) Nos. 146,452/80, 1,057/81, 6,237,81, 8,145/81, 9,749/81 and 9,750/81. Another factor is the degree of hardening with hardeners, such as formaldehyde of silver halide emulsion layer or undercoat layer disposed beneath the physical development nuclei layer. As is well known, with the increase in pH, the hardening of gelatin reaches a higher level in a shorter period of time. The Patent Applications cited above tell that after having been applied, the undercoat layer and the silver halide emulsion layer containing formaldehyde can be hardened by heating at 40° C. for 3 days. In spite of the level of hardening sufficiently high to meet the requirement for a printing plate, which can be attained by heating, the printing plate thus treated was found to have still a disadvantage in that the transerred silver in the image area composed of thin lines still retains the tendency of wearing off during the printing operation, often rendering the printing plate unsuitable for further printing. The present inventors considered that although the hardening level of gelatin is an important factor affecting the printing endurance, there might exist other participating factors and studied the problem from various angles. It was found as anticipated that the aforementioned defect is more enhanced with the decrease in the amount of silver per unit area, particularly when the silver content becomes below 0.8 mmole/m$^2$ of silver halide in terms of silver.

As stated previously, the printing endurance is diminished by the build-up of ink in non-image areas due to decreased hydrophilicity. The lithographic printing plate should withstand printing over an extended period of time without image loss or scumming. There exists a demand for the development of a lithographic printing plate with more improved printing endurance, though it is a difficult task to maintain two opposite properties of oleophilicity and hydrophilicity simultaneously at satisfying levels throughout the run over an extended period of time.

SUMMARY OF THE INVENTION

An object of this invention is to provide a lithographic printing plate with improved printing endurance, which utilizes the silver complex diffusion transfer process for imaging and to provide a method for making such a printing plate.

Another object of this invention is to provide a lithographic printing plate of low silver content with improved printing endurance, which utilizes the silver complex diffusion transfer process for imaging and to provide a method for making such a printing plate.

Further objects and advantages of this invention will become apparent from the following description.

As a result of an extensive study, the present inventors found that the above objects may be achieved by adjusting the pH of all of the gelatin-containing layers to a value below the isoelectric point of gelatin in a lithographic printing plate having at least one gelatin-containing layer disposed beneath a physical development nuclei layer bearing a transferred silver image which is utilized as ink-receptive areas.

DESCRIPTION OF THE INVENTION

Detailed description of the present invention is given below.

At first, a typical example of the preparation of the present lithographic printing plate will be described. A gelatin-containing undercoating composition of a pH adjusted to a value, e.g. 4.0, below the isoelectric point of the gelatin is coated together with antihalation carbon black and silica particles of 2 to 10 μm in average particle diameter on a support which has been treated to become hydrophilic or provided with a hydrophilic subbing layer. The undercoating composition contains formaldehyde as a hardener for the gelatin. The undercoating layer is then over-coated with a gelatino-silver halide emulsion, the pH of which has been adjusted to a value, e.g. 4.5, below the isoelectric point of the gelation. This emulsion also contains formaldehyde as a hardener and silica particles of 2 to 10 μm. The resulting coated specimen is heated at 40° C. to harden the gelatin. A reference specimen is prepared in the same manner as described above, except that the undercoating composition and the emulsion are adjusted to pH 6.0 which is higher than the isoelectric point of gelatin. The reference specimen is hardened by heating at 40° C. for 3 days. In order to adjust the degrees of hardening of both specimens to the same level, it is necessary for the specimen prepared according to this invention to be heated for a period of 2 to 5 times the duration of heating of the reference specimen. The duration of heating can be curtailed to a certain-extent by increasing the hardener content. Therefore, it has been found that it is preferred in this invention that a photographic material obtained by coating a silver halide emulsion layer on a support is heated at about 35° C.–about 50° C. for 5 days or more and thereafter a nuclei layer is coated on said emulsion layer. The level of hardening can be determined by a known method for testing mechanical resistance, for example by measuring the load applied to a ball-point needle. After having been adjusted to the same level of hardening, both specimens are coated with a common coating composition containing physical development nuclei to obtain photosensitive elements for lithographic printing. These elements are image-wise exposed, then processed by DTR process, and used in printing. On visual inspection, both specimens showed no significant difference with respect to the transferred silver pattern formed on the nuclei layer. Upon being used in printing, both specimens produce printed copies of no significant difference in reproduction quality until a fairly large number of copies have been printed. On further continuation of printing, however, thin line portions of the silver image on the reference printing plate are lost so that printing becomes no longer possible, whereas the printing plate of this invention remains unchanged and capable of producing much more number of printed copies of good quality.

Although the exact reason for the advantage of the present printing plate is unknown, it seems that in the lower pH region beyond the isoelectric point, the orientation and physical properties of the gelatin favor the retention or mechanical resistance of transferred silver particles. However, the object of this invention cannot be achieved by using gelatin as a hydrophilic colloid in the physical development nuclei layer and adjusting this layer to a pH value below the isoelectric point of this gelatin as described in Japanese Patent Application "Kokai" (Laid-open) No. 21,602/78. In the aforementioned example, the object of this invention is also not achieved if either the undercoating layer or the emulsion layer does not meet the requirements herein specified. The gelatin-containing layers disposed beneath the nuclei layer should be of a pH value smaller than the isoelectric point of each gelatin used in the layer (or smaller than the smallest isoelectric point, if a mixture of two or more types of gelatin is used), preferably by 0.3 or more especially preferably 0.5 or more. Preferred gelatin is a common lime-treated gelatin which is used alone or in combination with various natural or synthetic hydrophilic colloids as disclosed in Japanese Patent Application "Kokai" (Laid-open) No. 100,554/80.

Examples of other hydrophilic colloids include methylcellulose, sodium salt of carboxymethylstarch, hydroxyethylcellulose, hydroxyethylstarch, sodium alginate, polyvinyl alcohol, and polyvinylpyrrolidone. The acid which may be used to adjust pH to a value below the isoelectric point of gelatin is any of the inorganic and organic acids such as sulfuric acid and citric acid. The pH of gelatin-containing layer, as herein referred to, is the pH of the coating layer after coating and drying.

The present inventors made another effort to improve further the printing endurance of the lithographic printing plate described above and, as a result, found that the printing endurance of said printing plates, namely made from the photosensitive element in which all of the gelatin-containing layers disposed beneath the physical development nuclei layer have a pH value below the isoelectric point of the gelatin can be further improved by using a combination of photographic gelatin and a low molecular weight gelatin in at least one gelatin-containing layer of said photosensitive element. In one of the preferred embodiments of this invention, a combination of photographic gelatin and a low molecular weight gelatin is used in the undercoating layer. In another preferred embodiment, the gelatin combination is used also in the emulsion layer. In a typical example, such a printing plate is prepared in the same manner as in the aforementioned example, except that the support, which has been treated to become hydrophilic or provided with a hydrophilic subbing layer, is coated with, together with antihalation carbon black and silica particles of 2 to 10 μm, an undercoating composition containing the combination of two types of gelatin and adjusted to a pH value below the isoelectric point of the gelatin.

Gelatin is available in various forms such as alkali-treated gelatin, acid-treated gelatin, and gelatin derivatives manufactured by treating or reforming gelatin in various ways. Such gelatins generally have an average molecular weight of from several tens of thousands to a hundred thousand and several tens of thousands, as determined by terminal group analysis, amino acid composition analysis, light scattering, gel permeation, ultracentrifuging, or surface pressure measurement.

As known well, the gelatin-containing layer is laid by taking advantage of the phenomenon of gelation of gelatin which takes place after a gelatin coating composition is applied (this phenomenon is called setting of gelatin). The gelation of gelatin sol is said to be observable when the average molecular weight is greater than about 30,000. The gelatin which is customarily used in photographic products (i.e. photographic gelatin) has an average molecular weight of 100,000 or thereabout, generally from about 70,000 to about 150,000. The term "photographic gelatin", as used herein, means a gelatin having sufficient setting characteristics and customarily used in photographic products. A gelatin having an average molecular weight below about 30,000 is not generally used in photographic products, because it shows no or, if any, a feeble gelation tendency and a coating composition containing such a gelatine alone difficultly forms a good photographic layer. The term "low molecular weight gelatin," as herein used, means such a gelatin as noted above, which is different from the customarily used photographic gelatin. The average molecular weight of the low molecular weight gelatin is generally in the range of from about 3,000 to about 30,000, preferably from about 5,000 to about 20,000. A photographic gelatin naturally contains some low molecular weight gelatin, but it is different from the low molecular weight gelatin as used according to this invention.

According to this invention, the low molecular weight gelatin is used in an amount of about 3 to about 30 parts by weight for 100 parts by weight of photographic gelatin. If it is used in excess, there is the possibility of failure in the formation of a satisfactory gelatin-containing layer, resulting in reduced printing endurance of the printing plate. The low molecular weight gelatin is produced, for example, by the enzymatic decomposition of common photographic gelatin. The gelatin-containing layer according to this invention is preferably an undercoating layer, but may be the silver halide emulsion layer.

The photographic gelatin in the gelatin-containing layer according to this invention can be partly replaced by one or more hydrophilic polymeric binder materials such as starch, albumin, sodium alginate, hydroxyethylcellulose, gum arabic, polyvinyl alcohol, polyvinylpyrolidone, carboxymethylcellulose, polyacrylamide, styrene-maleic anhydride copolymers, and polyvinyl methyl ether-maleic anhydride copolymers. Further, an aqueous suspension (latex) of vinyl polymers may also be used. The polymeric binder content of the undercoating layer is generally 0.5 to 10 g/m², preferably 1 to 6 g/m². The undercoating layer can be incorporated with pigments or dyes for the purpose of preventing halation. More preferably, the undercoating layer contains fine powders of 2 to 10 μm in average particle size, preferably silica particles. The silver halide emulsion can be any of those used in photosensitive products. A preferred one is that described in Japanese Patent Application "Kokai" (Laid-open) No. 55,402/74 which contains silica particles of 2 to 10 μm.

The hardeners for use in the gelatin-containing layer according to this invention are subject to no special restriction with respect to the type and amount. Examples of known gelatin hardeners include aldehydes such as formaldehyde, glyoxal, and glutaraldehyde; compounds related to aldehydes such as mucochloric acid and 2,3-dihydroxy-1,4-dioxane; 6-membered nitrogen-containing heterocyclic compounds having 2 or more active halogen atoms; compounds having a vinyl group; compounds having an ethyleneimino or epoxy group; compounds having an N-methylol group, chrome alum, and dialdehyde starch which is a polymeric hardener. These compounds are used each alone or in combinations.

The silver halide emulsion comprises silver halides such as, for example, silver chloride, silver bromide, and silver chlorobromide and these silver halides containing iodides dispersed in the hydrophilic colloids listed above. The emulsion can be sensitized in various ways during its manufacture or before coating. The chemical sensitization can be effected in a manner well known to the art by using, for example, sodium thiosulfate, alkylthioureas, or gold compounds such as gold thiocyanide and gold chloride, or combinations of these compounds. The emulsion is sensitized usually to the spectral range of from about 530 to about 560 nm, though panchromatic sensitization is, of course, possible. The ratio of a hydrophilic colloid to silver halide is preferably 2 to 0.3 by weight. This invention is especially useful when the silver halide content is 0.8 mmol or less in terms of silver per square meter.

As the physical development nuclei, use may be made of those which are well known, such as metals including antimony, bismuth, cadmium, cobalt, palladium, nickel, silver, lead, and zinc, and sulfides thereof. The image receiving layer may or may not contain hydrophilic colloids such as gelatin, carboxymethylcellulose, gum arabic, sodium alginate, hydroxyethylstarch, dextrin, hydroxyethylcellulose, polystyrenesulfonic acid, vinylimidazole-acrylamide copolymer, and polyvinyl alcohol. The image receiving layer may contain hygroscopic substances such as, for example, sorbitol and glycerol; antiscumming pigments such as barium sulfate, titanium dioxide, china clay and silver; developing agents such as hydroquinone; and hardeners such as formaldehyde.

The support may be paper sheet; film materials such as, for example, cellulose acetate film, polyvinylacetal film, polystyrene film, polypropylene film, and polyethylene terephthalate film; composite film materials such as a polyester film, polypropylene film, or polystyrene film overlaid with polyethylene film; metals, metallized paper sheets, and metal-paper laminates. A paper support coated on one or both sides with an α-olefin polymer such as, for example, polyethylene is one of the desirable supports. The support may be incorporated with an antihalation dye or pigment.

The DTR processing solutions used in this invention may contain alkaline substances such as, for example, sodium hydroxide, potassium hydroxide, and trisodium phosphate; preservatives such as sulfites; silver halide solvents such as, for example, thiosulfates, thiocyanates, cyclic imides, thiosalicylic acid, and amines; thickeners such as, for example, hydroxyethylcellulose and carboxymethylcellulose; antifoggants such as, for example, potassium bromide, 1-phenyl-5-mercaptotetrazole, and compounds described in Japanese Patent Application "Kokai" (Laid-open) No. 26,201/72; developing agents such as, for example, hydroquinone and 1-phenyl-3-pyrazolidone; and development modifiers such as, for example, polyoxyalkylene compounds and onium compounds.

In the practice of silver complex diffusion transfer process, a developing agent may be present in the silver halide emulsion layer and/or the image receiving layer or other water permeable layers contiguous to said layers, as disclosed by British Pat. Nos. 1,000,115, 1,012,476, 1,017,273 and 1,042,477. If such is the case, the processing solution used in the development step may be an alkaline activation solution containing no developing agent.

The present printing plate is treated with, for example, a compound described in Japanese Patent Publication No. 29,723/73 and U.S. Pat. No. 3,721,559 to make the imaged areas ink receptive or to enhance the ink-receptivity of imaged areas. The printing process, desensitizing solution, and fountain solution are similar to those conventionally used in the art.

The invention is illustrated below in detail with reference to Examples, but the invention is not limited thereto.

EXAMPLE 1

On one side of the polyethylene coated (both sides coated) paper sheet, 135 g/m², was provided a mating layer containing silica particles of 5μ in average size. On the opposite side, which had been treated with corona discharge, was provided an antihalation layer containing carbon black and silica particles of 7μ in average size. The antihalation layer was overcoated with a high-speed silver chloride emulsion containing silica particles of 5μ in average particle size, which had been chemically sensitized at pH 6.0 and orthochromatically sensitized, at a coverage of 1 g/m² in terms of silver nitrate. Both the antihalation and emulsion layers contained formaldehyde as hardener. The coating was dried and heated at 40° C. The emulsion layer was overcoated with a palladium sulfide sol, which was prepared by a known method, at a rate of 5 m/minute to obtain a specimen of photosensitive element.

A reference specimen was prepared in the same manner as described above, except that pH of the antihalation layer and silver halide emulsion layer was 5.7 instead of 3.8 of the specimen according to this invention (the isoelectric point of the lime-treated gelatin used in both specimens was 5.1). The duration of heating at 40° C. was 3 days in the reference specimen, whereas it was 7 days in the specimen of this invention.

Both specimens of photosensitive elements were image-wise exposed in a letterpress process camera provided with an image reversal mechanism and developed at 30° C. for one minute with the following silver complex diffusion transfer developer.

| Transfer developer: | |
| --- | --- |
| Water | 750 ml |
| Sodium hydroxide | 15 g |
| Anhydrous sodium sulfite | 50 g |
| Hydroquinone | 10 g |
| 1-Phenyl-3-pyrazolidone | 1 g |
| Sodium thiosulfate | 15 g |
| Potassium bromide | 1 g |
| Made up with water to | 1 liter |

After the development, each specimen was passed through a pair of squeeze rollers to remove the excess developer and immediately treated in the following neutralizing bath at 25° C. for 20 seconds. After removal of the excess solution by the squeeze rollers, the specimen was dried at room temperature.

| Neutralizing bath: | |
| --- | --- |
| Water | 600 ml |
| Citric acid | 10 g |
| Sodium citrate | 35 g |
| Colloidal silica (20% suspension) | 5 ml |
| Ethylene glycol | 5 ml |
| Made up with water to | 1 liter |

Each specimen of the ligthographic printing plate thus prepared was mounted on an offset press, rubbed thoroughly with the following desensitizing (etch) solution, and run using the following fountain solution.

| Desensitizing solution: | |
| --- | --- |
| Water | 600 ml |
| Isopropyl alcohol | 400 ml |
| Ethylene glycol | 50 g |
| 3-Mercapto-4-acetamido-5-n-heptyl-1,2,4-triazole | 1 g |
| Fountain solution: | |
| Orthophosphoric acid | 10 g |
| Nickel nitrate | 5 g |
| Sodium nitrite | 5 g |
| Ethylene glycol | 100 g |
| Colloidal silica (20% suspension) | 28 g |
| Made up with water to | 2 liters |

The press employed was "A. B. Dick 350 CD" (Trademark for the offset press manufactured by A. B. Dick Co.). After printing 3,000 copies, thin line portions of the silver image were lost from the reference printing plate, whereas the printing plate of this invention could product 5,000 copies.

EXAMPLE 2

A reference photosensitive element and an element of this invention were prepared in the same manner as in Example 1, except that hydroquinone and 1-phenyl-3-pyrazolidone were added to the same physical development nuclei coating composition as used in Example 1 so that 0.8 g/m² of the former compound and 0.3 g/m² of the latter compound may be present in the coating layer. The conditions of the subsequent test were the same as in Example 1, except that the following developer was used.

| Transfer developer: | |
| --- | --- |
| Water | 800 ml |
| Trisodium phosphate | 75 g |
| Anhydrous sodium sulfite | 50 g |
| Potassium bromide | 0.5 g |
| 2-mercaptobenzoic acid | 1 g |
| Made up with water to | 1 liter |

After printing about 5,000 copies, thin line portions of the silver image were worn off from the reference printing plate, whereas the printing plate of this invention could produce about 9,000 copies.

Test results similar to those described above were obtained when pH of the antihalation and emulsion layers of the finished photosensitive element was adjusted to 5.8 (reference), 5.3 (reference), 4.8 (this invention) and 4.3 (this invention). More desirable results were obtained with pH 4.3 than with pH 4.8.

A reference photosensitive element and an element of this invention were prepared in the same manner as in Example 1, except that the silver halide content of the emulsion layer was doubled to 2 g/m² (amount of gelatin was also doubled). The reference printing plate showed less loss of the transferred silver in thin line image areas than in Example 1, but there still existed significant difference in printing endurance between both printing plates.

EXAMPLE 3

On one side of the polyethylene coated (both sides coated) paper sheet, 135 g/m², was provided a matting layer containing silica particles of 5μ in average particle size. On the opposite side, which had been exposed to corona discharge, was provided with an antihalation undercoating layer (adjusted to pH 4.0) containing carbon black and 20% by weight (based on photographic gelatin of an isoelectric point of 4.8) of silica particles of 7 μm in average size. The antihalation undercoating layer was overcoated with an orthochromatically sensitized high-speed silver chloride emulsion, which had been chemically sensitized at pH 6.0 and contained 5% by weight (based on photographic gelatin having an isoelectric point of 4.8) of silica particles of 7 μm in average size. The amount of gelatin in the undercoating layer was 3.0 g/m². The emulsion layer (adjusted to pH 4.0) contained 1.0 g/m² of gelatin and 1.0 g/m² of silver halide in terms of silver nitrate. Both the under coating layer and the emulsion layer contained as the hardener 50 mg of formaldehyde per g of gelatin. After drying, the resulting material was heated at 40° C. for 14 days.

The emulsion layer was then overcoated with the nuclei coating composition described in Example 2 of Japanese Patent Application "Kokai" (Laid-open) No. 21,602/78 and dried to obtain a lithographic photosensitive element (A) of this invention (the polymer in the nuclei layer was acrylamide-imidazole copolymer No. 3 and the hydroquinone content of the layer was 0.8 g/m$^2$). Other photosensitive elements shown in the following table were prepared in the same manner as described above, except that pH of the undercoating layer was varied as shown in the following table.

| Photosensitive element | pH |
|---|---|
| A (present invention) | 4.0 |
| Reference a | 5.0 |
| Reference b | 6.0 |

Each photosensitive material was heated at 40° C. for 7 days to obtain a photosensitive element. The photosensitive element was imagewise exposed in a letter-press process camera provided with an image reversal mechanism and developed at 30° C. for one minute with the following silver complex diffusion transfer developer.

| Transfer developer: | |
|---|---|
| Water | 700 ml |
| Potassium hydroxide | 20 g |
| Anhydrous sodium sulfite | 50 g |
| 2-Mercaptobenzoic acid | 1.5 g |
| 2-Methylaminoethanol | 1.5 g |
| Made up with water to | 1 liter |

After the development, each element was passed through a pair of squeeze rollers to remove the excess developer and immediately treated in the following neutralizing bath at 25° C. for 20 seconds. After removing the excess solution by the squeeze rollers, the element was dried at room temperature.

| Neutralizing bath: | |
|---|---|
| Water | 600 ml |
| Citric acid | 10 g |
| Sodium citrate | 35 g |
| Colloidal silica (20% suspension) | 5 ml |
| Ethylene glycol | 5 ml |
| Made up with water to | 1 liter |

The resulting printing plate was mounted on an offset press, rubbed thoroughly with the following desensitizing solution, and run using the following fountain solution.

| Desensitizing solution: | |
|---|---|
| Water | 600 ml |
| Isopropyl alcohol | 400 ml |
| Ethylene glycol | 50 g |
| 3-Mercapto-4-acetamido-5-n-heptyl-1,2,4-triazole | 1 g |
| Fountain solution: | |
| Orthophosphoric acid | 10 g |
| Nickel nitrate | 5 g |
| Sodium sulfite | 5 g |
| Ethylene glycol | 100 g |
| Colloidal silica (20% dispersion) | 28 g |
| Made up with water to | 2 liters |

The press employed was "A. B. Dick 350 CD" (Trademark for the offset press manufactured by A. B. Dick Co.). The performance of the printing plate was evaluated in terms of number of copies produced before the printing became impossible due to scumming of the non-image areas or the loss of silver image caused by wearing.

| Rating mark | Number of copies |
|---|---|
| ⊚ | 8,000–10,000 |
| o | 5,000–8,000 |
| x | <5,000 |

The results obtained were as shown in Table 1.

TABLE 1

| Printing plate | Printing endurance | |
|---|---|---|
| | Scumming | Loss of images |
| A (present invention) | o | ⊚ |
| Reference a | x | o |
| Reference b | x | o |

EXAMPLE 4

A lithographic printing plate was prepared and tested in the same manner as described in the case of printing plate A of Example 3, except that the antihalation undercoating layer contained 0.2 g/m$^2$ of 1-phenyl-3-pyrazolidone; the palladium sulfide nuclei layer contained 0.5 g/m$^2$ of hydroquinone; the undercoating layer and the emulsion layer contained formaldehyde in an amount of 100 mg/g of gelatin and dimethylolethylene urea in an amount of 100 mg/g of gelatin; and low molecular weight gelatin having a molecular weight of about 18,000 was used in the undercoating layer. The printing plate produced 10,000 or more of copies without scumming in non-image areas and loss of transferred silver image.

What is claimed is:

1. A photosensitive element for the production of lithographic printing plates comprising a support, a physical development nuclei layer, and at least one gelatin-containing layer including a hardener and a silver halide emulsion layer disposed under said nuclei layer, which is adapted to the silver complex diffusion transfer process to utilize the transferred silver image on said nuclei layer as ink-receptive areas, all of the gelatin-containing layers having a pH value below the isoelectric point of the gelatin used in each layer.

2. A photosensitive element for the production of lithographic printing plate according to claim 1 comprising a support, a physical development nuclei layer, and at least one gelatin-containing layer including a hardener and a silver halide emulsion layer disposed under said nuclei layer, which is adapted to the silver complex diffusion transfer process to utilize the transferred silver image on said nuclei layer as ink-receptive areas, all of said gelatin-containing layer having a pH value below the isoelectric point of the gelatin used in each layer and at least one of said gelatin-containing layers containing both a photographic gelatin having an average molecular weight of about 70,000 to about 150,000 and also a separate low molecular weight gelatin having an average molecular weight of about 3,000 to about 30,000.

3. A photosensitive element according to claim 1, wherein the gelatin-containing layer has a pH value smaller than the isoelectric point of the gelatin contained in said layer by 0.3 or more.

4. A photosensitive element according to claim 2, wherein the gelatin-containing layer has a pH value smaller than the isoelectric point of the gelatin contained in said layer by 0.3 or more.

5. A photosensitive element according to claim 2, wherein the average molecular weight of the low molecular weight gelatin is about 5,000 to about 20,000.

6. A photosensitive element according to claim 2, wherein the gelatin-containing layer which contains photographic gelatin and a low molecular weight gelatin is an undercoating layer.

7. A photosensitive element according to claim 3, wherein the gelatin-containing layer has a pH value smaller than the isoelectric point of the gelatin contained in said layer by 0.5 or more.

8. A photosensitive element according to claim 4, wherein the gelatin-containing layer has a pH value smaller than the isoelectric point of the gelatin contained in said layer by 0.5 or more.

9. A photosensitive element according to claim 1, wherein an undercoat layer contains silica particles of 2 to 10 μm in average particle diameter.

10. A photosensitive element according to claim 1, wherein the emulsion layer contains silica particles of 2 to 10 μm in average particle diameter.

11. A photosensitive element according to claim 1, wherein an undercoat layer and the emulsion layer contain silica particles of 2 to 10 μm in average particle diameter.

12. A method for making a lithographic printing plate, which comprises imagewise exposing the photosensitive element according to claim 1 and developing the exposed element with a silver complex diffusion transfer developer.

13. A method for making a lithographic printing plate, which comprises imagewise exposing the photosensitive element according to claim 2 and developing the exposed element with a silver complex diffusion transfer developer.

* * * * *